(12) United States Patent
Pinto et al.

(10) Patent No.: US 7,943,479 B2
(45) Date of Patent: May 17, 2011

(54) INTEGRATION OF HIGH-K METAL GATE STACK INTO DIRECT SILICON BONDING (DSB) HYBRID ORIENTATION TECHNOLOGY (HOT) PMOS PROCESS FLOW

(75) Inventors: Angelo Pinto, Allen, TX (US); Manuel A. Quevedo-Lopez, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 345 days.

(21) Appl. No.: 12/193,956

(22) Filed: Aug. 19, 2008

(65) Prior Publication Data

US 2010/0047993 A1  Feb. 25, 2010

(51) Int. Cl.
*H01L 21/76* (2006.01)
(52) U.S. Cl. ............... 438/405; 438/198; 257/E21.598; 257/E21.625
(58) Field of Classification Search ............ 438/198, 438/143, 229, 405; 257/E21.625, E21.639, 257/E21.598
See application file for complete search history.

(56) References Cited

U.S. PATENT DOCUMENTS

| | | | |
|---|---|---|---|
| 7,060,585 B1 * | 6/2006 | Cohen et al. | 438/355 |
| 7,291,539 B2 * | 11/2007 | Fogel et al. | 438/424 |
| 2002/0001917 A1 * | 1/2002 | Park | 438/424 |
| 2006/0049460 A1 * | 3/2006 | Chen et al. | 257/347 |
| 2006/0276011 A1 | 12/2006 | Fogel et al. | |
| 2007/0052027 A1 * | 3/2007 | Ke et al. | 257/351 |
| 2008/0006876 A1 * | 1/2008 | Wang et al. | 257/347 |
| 2008/0111214 A1 * | 5/2008 | Yang et al. | 257/627 |
| 2008/0220595 A1 * | 9/2008 | Lin et al. | 438/511 |
| 2008/0237809 A1 * | 10/2008 | Huang et al. | 257/622 |
| 2008/0248626 A1 * | 10/2008 | Liu et al. | 438/424 |
| 2008/0258181 A1 * | 10/2008 | Cannon et al. | 257/255 |
| 2008/0299730 A1 * | 12/2008 | Callegari et al. | 438/287 |
| 2009/0057816 A1 | 3/2009 | Pinto et al. | |
| 2009/0218625 A1 * | 9/2009 | Adetutu et al. | 257/351 |

* cited by examiner

*Primary Examiner* — Caridad M Everhart
(74) *Attorney, Agent, or Firm* — Warren L. Franz; Wade J. Brady, III; Frederick J. Telecky, Jr.

(57) ABSTRACT

A method for semiconductor processing provides a DSB semiconductor body having a first crystal orientation layer, and a second crystal orientation layer, and a border region disposed between the first and second crystal orientations. A high-k metal gate stack is deposited over the first crystal orientation layer that comprises an insulation layer, a high-k dielectric layer, a first metal layer, and a second metal layer thereon.

20 Claims, 5 Drawing Sheets

INTEGRATION OF HIGH-K METAL GATE STACK INTO DIRECT SILICON BONDING (DSB) HYBRID ORIENTATION TECHNOLOGY (HOT) PMOS PROCESS FLOW

FIELD OF THE INVENTION

The present invention relates generally to semiconductor processing, and more particularly to a method for integrating a gate stack comprising a high-k dielectric and a metal gate electrode ("high-k metal gate stack") into a pMOS process flow.

BACKGROUND OF THE INVENTION

Electrical and physical limitations exist on the extent to which $SiO_2$ gate dielectrics can be made thinner. These include gate leakage currents tunneling through the thin gate oxide, limitations on the ability to form very thin oxide films with uniform thickness, and the inability of very thin $SiO_2$ gate dielectric layers to prevent dopant diffusion from the gate polysilicon into the underlying channel ("polysilicon depletion"). Accordingly, recent downscaling efforts have focused on high-k dielectric materials having dielectric constants greater than that of $SiO_2$, which can be formed in a thicker layer than scaled $SiO_2$, and yet which produce equivalent field effect performance. A thicker high-k dielectric layer can thus be formed to avoid or mitigate tunneling leakage currents, while still achieving the required electrical performance equivalent (e.g., capacitance value) of a thinner $SiO_2$.

With the relatively thick gate dielectrics and gate contact structures of the past, the polysilicon depletion issue was not critical to ensuring desired device performance. However, as gate dielectrics and gate contacts continue to become smaller through scaling, the polysilicon depletion problem is more pronounced, wherein polysilicon depletion regions of 3 to 4 angstroms become a significant fraction of the overall effective gate capacitance. Thus, while polysilicon gate contacts have previously offered flexibility in providing dual work functions for CMOS processes, the future viability of conventional polysilicon gate technology is lessened as scaling efforts continue.

In addition, improving the control of short channel effects and enhancing performance are major challenges in scaling CMOS devices. For example, short channel effects can be mitigated by increasing gate capacitance. This implies the use of thinner gate dielectrics which require the introduction of high-k materials to overcome the exponential increase of direct tunneling through gate oxide. Accordingly, attention has recently been directed again to the possibility of using metal gate contacts in CMOS products, where the metal gate materials conceivably do not need doping for conductivity improvement. Although this approach presumably avoids polysilicon depletion issues with respect to gate capacitance, there remains a need for dual or differentiated work function capability (e.g., for pMOS and nMOS transistors) in CMOS processes. In this regard, metal work functions are not shifted as easily by the same amounts as was the case for polysilicon. In addition, transistors with high-k metal gates have degraded carrier mobility. Accordingly, there is a need for improved CMOS transistor gate designs and fabrication techniques by which the benefits of scaling can be achieved while avoiding or mitigating the degraded carrier mobility found in conventional devices.

SUMMARY OF THE INVENTION

Thus, a need exists for a method to integrate high-k metal gates into semiconductor fabrication techniques that provide for thinner gate dielectrics (low Tinv) and achieve band-edge work function while improving carrier mobility. The following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

The present invention is generally directed toward a method for integrating a high-k metal gate stack into a substrate formed by Direct Silicon Bonding (DSB) and Hybrid Orientation Technology (HOT) for a pMOS device. In accordance with one example, a method for semiconductor processing is provided, comprising a semiconductor body having a surface, wherein the semiconductor body comprises a first region, a second region and a border region disposed therebetween. The first region has a first crystal orientation associated therewith and the second region has a second crystal orientation associated therewith, wherein the first crystal orientation differs from the second crystal orientation. A high-k metal gate is deposited on the first region of the semiconductor body, wherein the high-k metal gate stack comprises a first metal layer of a predetermined thickness extending above the semiconductor body and a second metal layer thereon.

In accordance with the present invention, a sacrificial portion of the semiconductor body is removed from the surface thereof, wherein the sacrificial portion extends across the surface of the semiconductor body and has a predetermined thickness extending into the semiconductor body. By removing the sacrificial portion of the semiconductor body defects can be at least partially removed. According to one example, the surface of the semiconductor body is oxidized, therein defining the sacrificial portion. Accordingly, the oxidation of the surface at least partially consumes defects, and the now-oxidized sacrificial portion of the semiconductor body can be removed, for example, by a wet etch of the semiconductor body. In one example, the oxidation of the surface of the semiconductor body comprises a low temperature thermal oxidation of the semiconductor body at less than approximately 900C.

According to another example, oxidizing the surface of the semiconductor body further comprises forming a step in the semiconductor body between the first region and the second region, wherein the step in the semiconductor body remains after the sacrificial portion is removed. The formation of the step, for example, is based, at least in part, on a difference in a rate of oxidation of the surface between the first region and the second region. In one particular example, one or more alignment marks may be generated on the semiconductor body based, at least in part, on the step in the semiconductor body between the first region and the second region. The one or more alignment marks may be then further used in a subsequent lithographic process.

In another aspect of the present invention, the sacrificial portion of the semiconductor body is removed by a chemical-mechanical polish (CMP) of the surface of the semiconductor body. For example, anywhere between approximately 30 nm and 60 nm of the body (the predetermined thickness of the sacrificial portion) is removed by CMP.

Thus, to the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Accordingly, the present invention will now be described with reference to the drawings, wherein like reference numerals are used to refer to like elements throughout. It should be understood that the description of these aspects are merely illustrative and that they should not be taken in a limiting sense. In the following description, for purposes of explanation, numerous specific details are set forth in order to provide a thorough understanding of the present invention. It will be evident to one skilled in the art, however, that the present invention may be practiced without these specific details.

Recently, specialty semiconductor substrates have been utilized to improve the performance of the nFETs and pFETs. For example, the strong dependence of carrier mobility on silicon orientation has led to the use of hybrid orientation technology (HOT) or direct silicon bond (DSB) silicon substrates, wherein nFETs are formed in (100) crystal orientation silicon (e.g., the orientation in which electron mobility is higher) and pFETs are formed in (110)-oriented Si (the orientation in which hole mobility is higher). In addition, devices can be enhanced by reducing gate depletion with high-k metal gate stacks, although carrier mobility is reduced. Therefore, devices with high-k metal gate stacks useful for thinner gate dielectrics (low Tox inversion), but degrade carrier mobility, can be improved with fabrication using DSB HOT.

HOT or DSB semiconductor processing conventionally utilize amorphization/templated recrystallization (ATR) methods for fabricating hybrid orientation substrates, wherein a first semiconductor layer having a first crystalline orientation is directly bonded to a second semiconductor layer having a second crystalline orientation, wherein the second crystalline orientation differs from the first. Selected areas of the first semiconductor layer are amorphized by ion implantation, and then recrystallized into the orientation of the second semiconductor layer, wherein the second semiconductor layer is used as a crystal template for the recrystallization.

Figure 1:
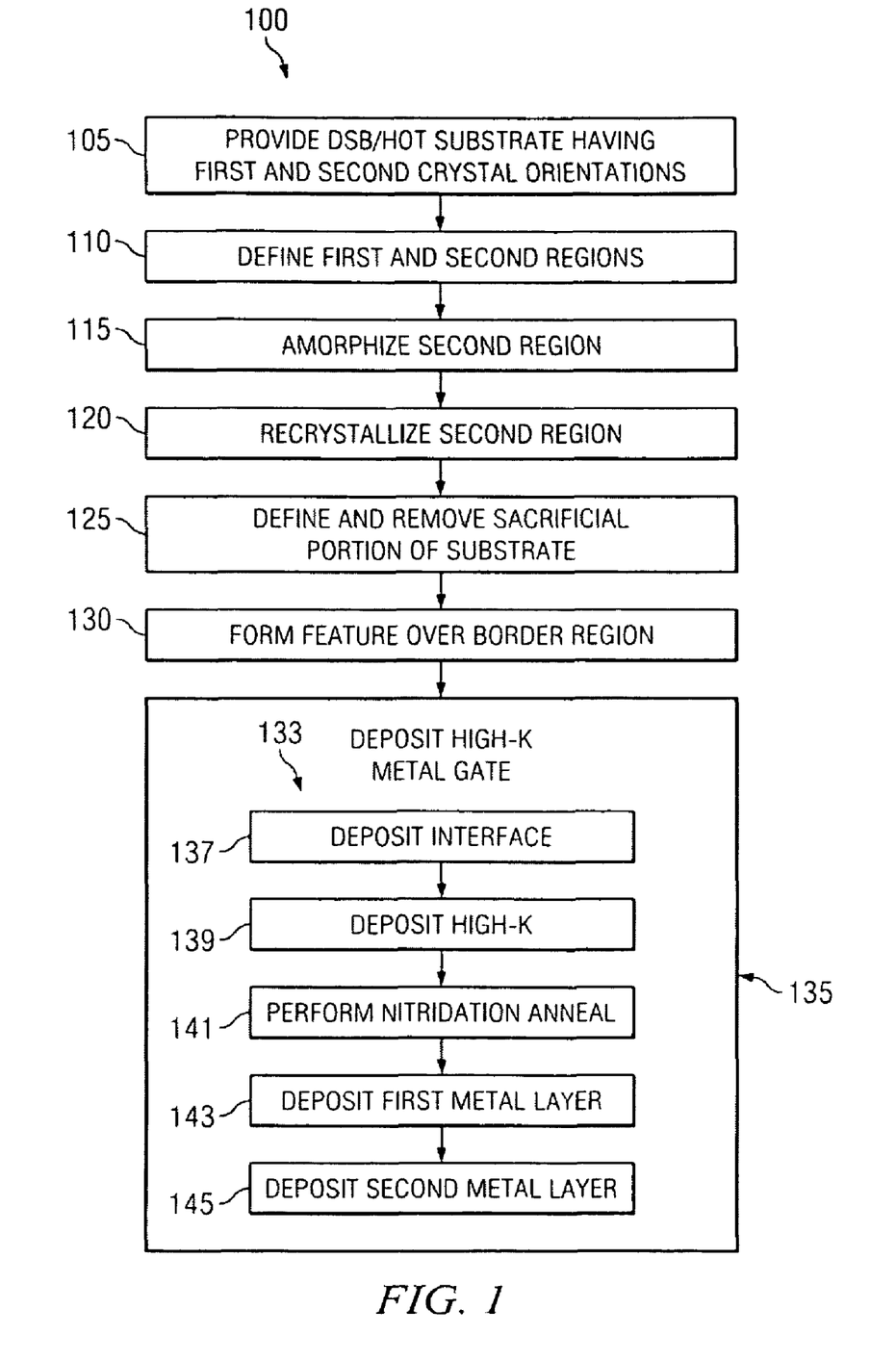
FIG. 1 illustrates a block diagram schematic of a method for processing a semiconductor workpiece in accordance with one exemplary aspect of the present invention.

Referring to the Figures, FIG. 1 illustrates a method 100 for a process flow that integrates the orientation change of DSB/HOT, into a specific high-k metal-gate pMOS gate stack according to one aspect of the present invention. FIGS. 2A-2F further illustrate examples of acts shown in FIG. 1 at various stages of processing, as will be described in greater detail infra. It should be noted that while example methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

In act 105 of FIG. 1, a direct silicon bond (DSB) semiconductor body (e.g., a previously-formed DSB silicon substrate or wafer) or a semiconductor body or substrate utilizing hybrid orientation technology (HOT) is provided. The body, for example, in act 110, defines one or more first regions and one or more second regions, wherein a first crystal orientation is desired in the one or more first regions and a second crystal orientation is desired in the one or more second regions for future formation of various CMOS circuits, such as pFETs and nFETs. One or more border regions are further defined between the one or more first regions and the one or more second regions. In act 115, the one or more second regions are amorphized, such as by ion implantation. In act 120, the one or more second regions are recrystallized, wherein the one or more second regions are crystallized into the second crystal orientation. In accordance with the present invention, a sacrificial portion or layer of the body is defined and removed in act 125, wherein the one or more defects are at least partially removed, as will be discussed in further detail infra. In one example, the at least partial removal of the one or more defects is accomplished by oxidation of a surface of the body. Alternatively, the one or more defects are at least partially removed by a chemical-mechanical polish of the surface of the body. Accordingly, in act 130, one or more features, such as one or more shallow trench isolation (STI) features, are formed in the border region. The STI feature can consume defects associated therewith and that may be remaining after the sacrificial layer is removed, such as by changing the orientation of the border region. For example, the border regions triangular morphology can be replaced by the STI feature.

In act 135 the high-k metal gate is deposited on the first region of the semiconductor body. This can be done after a pre-gate clean providing for a substantially and relatively smooth surface. The high-k metal gate stack comprises a first metal layer of predetermined thickness extending above the semiconductor body and also a second metal layer thereon. For example, the first metal layer can be from 0.2 to 2.0 nanometers thick.

Depositing the high-k metal gate stack in act 135 comprises a method 133. It should be noted that while example methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

In act 137 an interface layer comprising at least one of: $SiO_2$ and Rapid Thermal Nitric Oxide (RTNO), is deposited on the first region of the semiconductor body, wherein the first region has a different orientation than the second region. The interface layer is of a predetermined thickness. For example, the predetermined thickness of the interface layer may be 0.3 nanometers to about 1.0 nanometer, such as 0.75 nanometers for example. In one embodiment, the deposition of the interface layer can be performed at about 700C.

In act 139 formation of the high-k dielectric is performed. This formation can be of a predetermined thickness. For example, the predetermined thickness may be 1.5 to 4.0 nanometers, such as 2.0 nanometers. The high-k dielectric material can comprise at least one of the following compounds: $HfO_2$, HfSiO, HfZrO, $ZrO_2$, and ZrSiO. In act 141 nitrogen is introduced by an anneal process. For example, nitrogen can be introduced through a plasma anneal or a thermal anneal. The introduction could also be a nitridation anneal or an ammonia anneal. Any process able to incorporate nitrogen into the high-k material can be utilized in act 141. In addition, impurities or defects may be incorporated, which also may need to be eliminated. Therefore, a sequential anneal can be performed. For example, a nitrogen anneal may first be done following an ammonia anneal, or vice versa, an ammonia anneal may first be done following a nitrogen anneal. Any sequence known to remove or minimize impurities can be implemented.

At act 143 a first metal layer is deposited on the high-k dielectric layer. At act 145 a second metal layer is deposited on the first metal layer. The first metal layer is different from the second metal layer, and can comprise at least one of the following compounds: MoAlN, AlN, Al2O2, RuO2, RuAlN, and/or RuAlO. In addition, the second metal layer is different from the first metal layer, and comprises: TaN, TaSiN, RuN, and/or TaSiO.

In one embodiment, the thickness of the metal layers can from 0.2 to 2.0 nanometers thick, such as a thickness of 1.0 nanometers. In addition, two different methods may be employed for depositing the first and second metal layers at acts 143 and 145. In a first method, the first metal layer can comprise a layer of at least one of the following compounds: MoAlN, AlN, AlN, Al2O2, RuO2, RuAlN, and RuAlO, and therefore, the second metal layer can comprise a layer of at least one of the following compounds: TaN, TaSiN, and RuN. Alternatively in one embodiment, a second metal for depositing the first metal layer and the second metal layer can comprise a first layer comprising of at least one of the following compounds: MoAlN, and RuAlN, and therefore, the second metal layer can comprise a layer of at least one of the following compounds: TaN, TaSiO, and RuN.

A layer of polysilicon can then be deposited on the high-k metal layers formed in the pMOS region of the device and can be of a predetermined thickness. For example, this predetermined thickness of silicon material can be about 100 to 150 nanometers. In one embodiment, the nMOS region can be formed with a polysilicon gate. Standard CMOS process flow known to one of ordinary skill in the art can then follow.

Figure 2A:
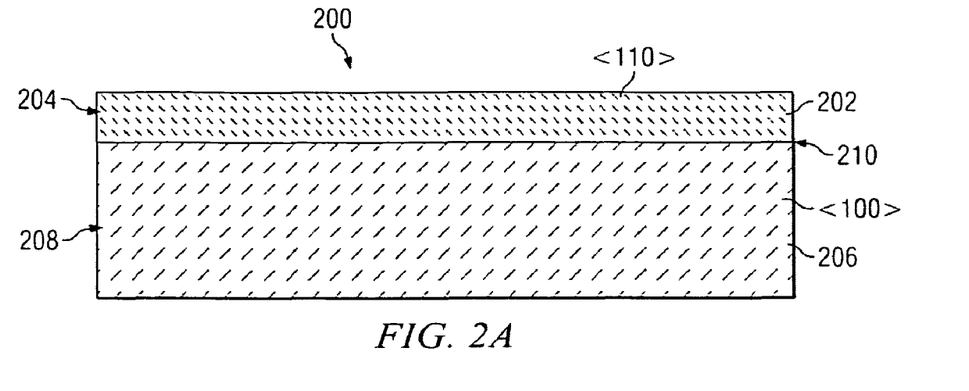
FIGS. 2A-2L illustrate cross-sectional views of a semiconductor workpiece undergoing defect removal with formation of a high-k metal gate stack in accordance with several aspects of the invention

FIGS. 2A-2F illustrate one example of the method 100 of FIG. 1. FIG. 2A, for example, illustrates act 105 of FIG. 1, wherein a DSB semiconductor substrate 200 is provided in its initial form. The substrate comprises a top layer 202 having a first crystal orientation 204 associated therewith, and a handle layer 206 having a second crystal orientation 208 associated therewith, wherein the top layer 202 and the handle layer 206 are bonded at an interface 110 disposed therebetween. The first crystal orientation 104 differs from the second crystal orientation 208 of the substrate 200 differ from one another. For example, the first crystal orientation 204 is one of a (110) and (100) orientation, while the second crystal orientation 208 is the other of the (110) and (100) orientation. Alternatively, the first crystal orientation 204 and the second crystal orientation 208 of the respective top layer 202 and handle layer 206 may be selected from any of the (100), (110), (111), and other major and minor Miller indices, so long as the orientations differ from one another.

Figure 2B:
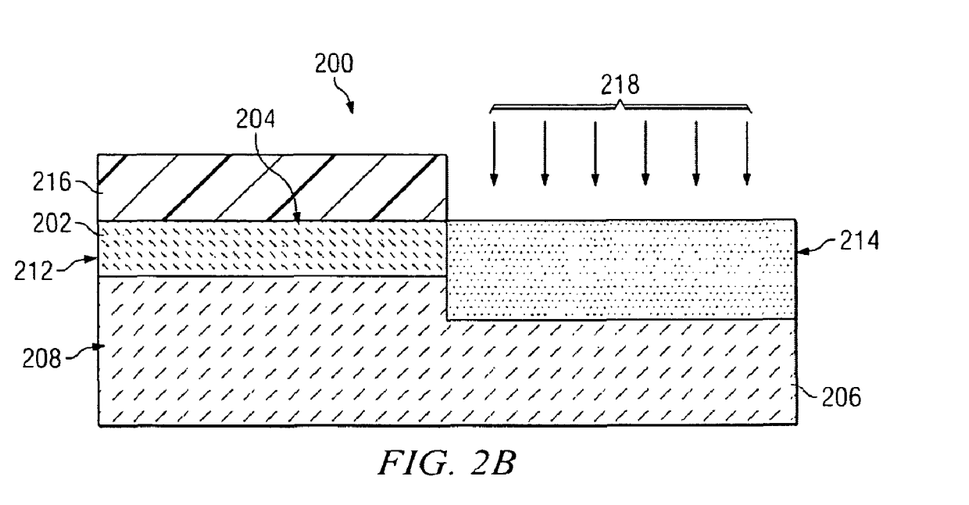

According to the invention, act 110 of FIG. 1 is illustrated in FIG. 2B, wherein a first region 212 and a second region 214 are defined in the substrate 200. According to one example, the first region 212 and the second region 214 are generally defined by masking the first region with a photoresist layer 216. Act 115 of FIG. 1 is further illustrated in FIG. 2B, wherein the second region 214 is subjected to an ion implantation 218, therein amorphizing the second region. The ion implantation 218, for example, comprises implanting silicon ions into the second region 214, wherein the ion implantation has an energy of between approximately 120 KeV and 150 KeV and a dosage of between approximately $2.5 \times 10^{15}$ to $5.0 \times 10^{15}$ ions/cm². Alternatively, the second region 214 may be amorphized by implanting germanium, argon, or other ions, and any amorphization is contemplated as falling within the scope of the present invention.

Figure 2C:
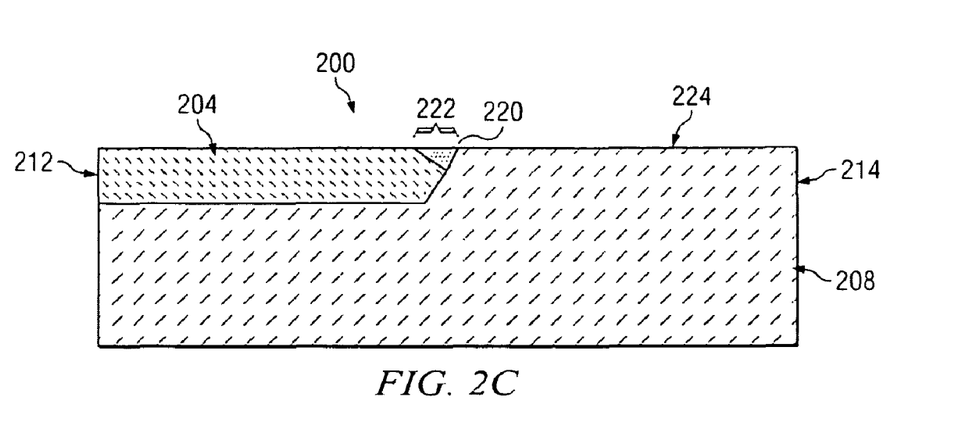

FIG. 2C illustrates the result of performing act 120 of FIG. 1, wherein the second region 214 is recrystallized, wherein the amorphized second region is recrystallized using the second crystal orientation 208 of the handle layer 206 of FIG. 2A as a template. Thus, the second region 214 of FIG. 2C recrystallizes into the second crystal orientation 208. For example, the recrystallization of the second region 214 comprises a solid phase epitaxy (SPE) process in an ambient nitrogen environment at a temperature ranging from approximately 550C to approximately 700C. Subsequent to the recrystallization of the second region 214, for example, a high temperature anneal (e.g., greater than 1050C) of the substrate 200 may be performed in order to minimize residual damage (e.g., EOR damage).

In the process of recrystallization of act 120 of FIG. 1, however, a defect 220 of FIG. 2C may be generated at a border region 222 between the first region 212 and second region 214. The defect 220, for example, is associated with the difference between the first crystal orientation 204 and second crystal orientation 208 meeting at or near a surface 224 of the substrate 200, wherein differing speeds of crystal growth and mismatches in lattice constants cause crystalline mismatches in the border region 222.

Figure 2D:
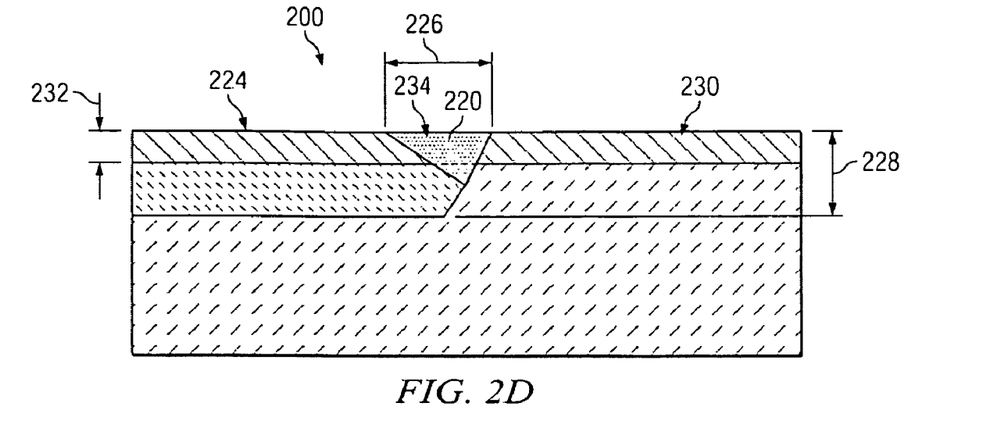

In accordance with the present invention, FIG. 2D illustrates the substrate 200 of FIG. 2C in greater detail, wherein, in the present example, the defect 220 has a first lateral width 226 at the surface 224 of the semiconductor substrate 200 and a first depth 228 generally extending into the semiconductor substrate. A sacrificial portion 230 of the semiconductor substrate 200 is further defined in FIG. 2D, wherein the sacrificial portion extends across the surface 224 of the semiconductor substrate 200 and has a predetermined thickness 232 extending into the semiconductor substrate from the surface thereof. The predetermined thickness 232 in the present example encompasses at least a portion 234 of the defect 220. While the predetermined thickness 232 illustrated in FIG. 2D is less than the first depth 228 of the defect 220, it should be noted that the predetermined thickness can alternatively be at least the first depth of the defect, thus encompassing all of the defect.

Figure 2E:
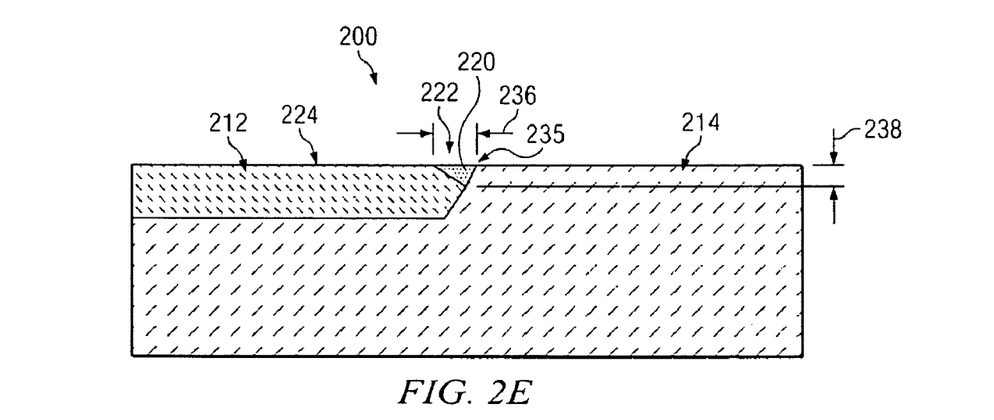

FIG. 2E illustrates the result of performing act 125 of FIG. 1, wherein the sacrificial portion 230 has been removed, therein at least partially removing the defect 220. For example, the surface 224 of the semiconductor substrate 200 of FIG. 2D is oxidized to the predetermined thickness 232 (e.g., 70 nm to 80 nm) via a low temperature thermal oxidation of the semiconductor substrate at less than approximately 900C. Such a low temperature oxidation, for example, at least partially consumes the defect 220, while advantageously maintaining the thermal budget of the processing. The oxidized sacrificial portion 230 can be further removed via a wet etch of the substrate 200, thus at least partially removing the defect 220. Alternatively, the sacrificial portion 230 of the semiconductor substrate 200 can be removed using a chemical-mechanical polish of the surface 224 of the semiconductor substrate, therein removing the predetermined thickness of the sacrificial portion. For example, a CMP of the surface 224 down to a predetermined thickness ranging between approximately 30 nm and 60 nm would produce an acceptable result.

On the other hand, the result of oxidizing and removing the predetermined thickness 232 of the semiconductor substrate 200, for example, further advantageously comprises forming a step 235 in the semiconductor substrate 200 between the first region 212 and the second region 214 (where the defect 220 is partially removed), wherein the formation of the step is based, at least in part, on a difference in a rate of oxidation of the surface 224 between the first region and the second region. Accordingly, the step 235 in the semiconductor substrate 220 remains after the sacrificial portion is removed with the wet etch. The step 235 can be further utilized, for example, in defining one or more alignment marks on the semiconductor substrate 200, wherein the alignment marks can be further utilized in subsequent processing, such as in subsequent lithographic processing.

Figure 2F:
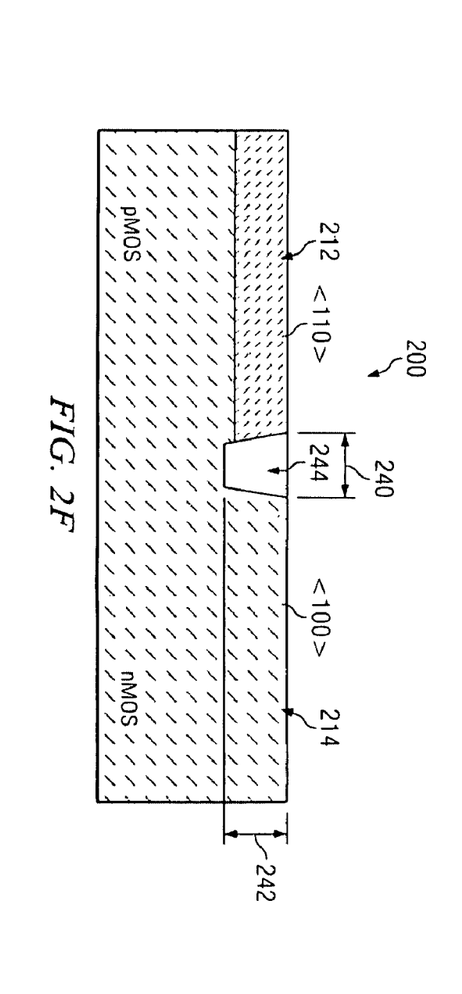

Act 130 of FIG. 1 describes forming a feature, such as an STI feature, over the border region 222, therein fully consuming any remaining portion of the defect 220. For example, after removing the sacrificial portion 230 of the semiconductor substrate 200 of FIG. 2D, the defect 220 illustrated in FIG. 2E has a second lateral width 236 at the surface 224 of the semiconductor substrate and a second depth 238 extending into the semiconductor substrate. Preferably, as illustrated in FIG. 2F, a width 240 and a depth 242 of feature 244 (e.g., an STI feature) are greater than the respective second lateral width 236 and second depth 238 of the defect 220 of FIG. 2E, thus fully consuming the defect 220. Accordingly, the present invention advantageously allows the formation of a feature 244 having a width that is less than approximately 75 nm, while eliminating corner or border defects in an efficient manner.

Thinner gate dielectrics can be formed with high-k metal gate stacks, therein controlling short channel effects, such as direct tunneling through oxide, and enhancing transistor performance. In one embodiment, pMOS devices with high-k metal gate stacks can be improved by integrating such stacks on (110)-oriented crystal fabricated using DSB HOT.

FIGS. 2G-2L illustrate act 135 of FIG. 1. In one embodiment, a high-k metal gate stack is deposited over the first region of the semiconductor body that is of a different crystal orientation than the second region of the semiconductor body. For example, the crystal orientation may be a (110)-oriented crystal fabricated by DSB HOT in the second region and the second region may be a (100) crystal orientation where a method for forming a polysilicon gate can be employed along with the high-k metal gate formed in the pMOS regions. As discussed above, any orientation may be envisioned with the first crystal orientation of a different crystal orientation than the second crystal orientation.

Figure 2G:
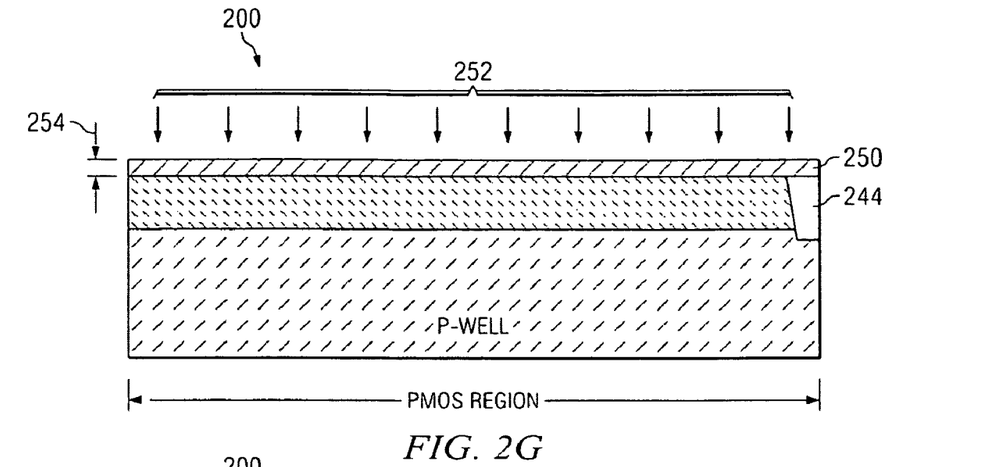

The high-k metal gate stack can comprise a first metal layer of a predetermined thickness extending above the semiconductor body. FIG. 2G illustrates a pMOS region that extends to the feature 244 of FIG. 2F as an example for depositing a high-k metal gate stack. FIG. 2G, for example, illustrates act 137 of FIG. 1, wherein an interface layer 250 is deposited by a deposition process 252. The interface layer 250 has a predetermined thickness 254. The predetermined thickness can be about 0.3 nanometers to about 1.0 nanometer, such as 0.8 nanometers for example. The deposition process 252 can be performed at about 700C with an interface layer material that comprises at least one of the following: $SiO_2$ and Rapid Thermal Nitric Oxide (RTNO).

Figure 2H:
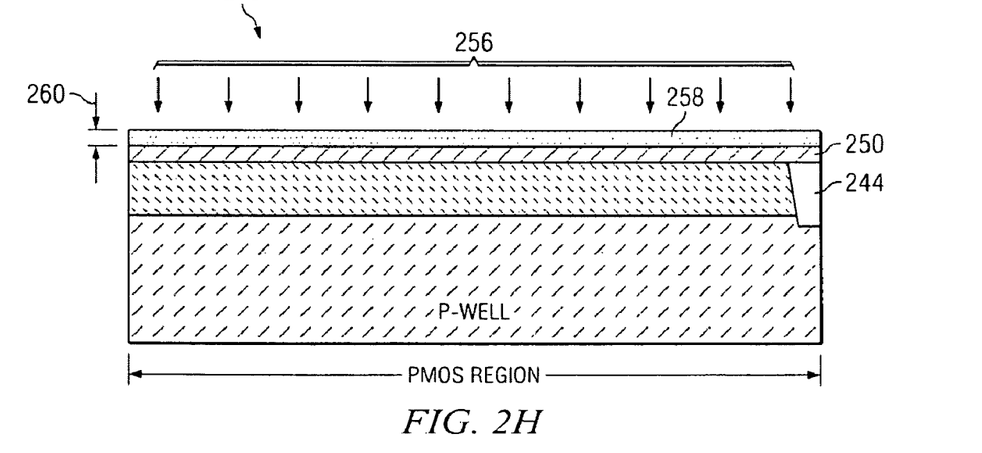

FIG. 2H illustrates a deposition 256 of a high-k dielectric layer 258 on the semiconductor substrate 200 for a pMOS region in fabrication. In one embodiment, the high-k material is deposited on the interface layer 250 and is a predetermined thickness 260. The predetermined thickness 260 can be about 1.5 nanometers to 4.0 nanometers thick of a high-k material. The high-k dielectric layer 258 can comprise at least one of: $HfO_2$, HfSiO, HfZrO, $ZrO_2$, and ZrSiO.

Figure 2I:
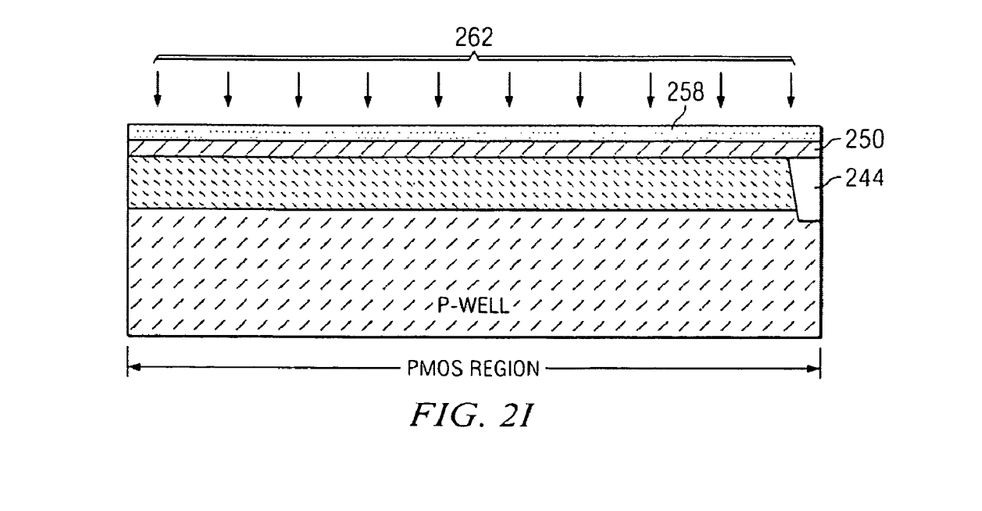

FIG. 2I illustrates a nitridation anneal being performed to incorporate nitrogen into the high-k dielectric layer 258 of a pMOS region for example. The nitridation anneal may incorporate nitrogen through a plasma anneal and/or thermal anneal that is known in the art. The nitrogen content may be about 20% nitrogen, for example, but may comprise other concentrations also. In one embodiment, impurities or defects may also be introduced, therefore a sequential post nitridation anneal may be performed also in order to emulate these impurities. Any sequence may be envisioned for overcoming such impurities or minimizing such defects. For example, a nitrogen anneal may first be performed an subsequently an ammonia anneal may be performed, or vice versa, an ammonia anneal may be performed and then subsequently a nitrogen anneal.

Figure 2J:
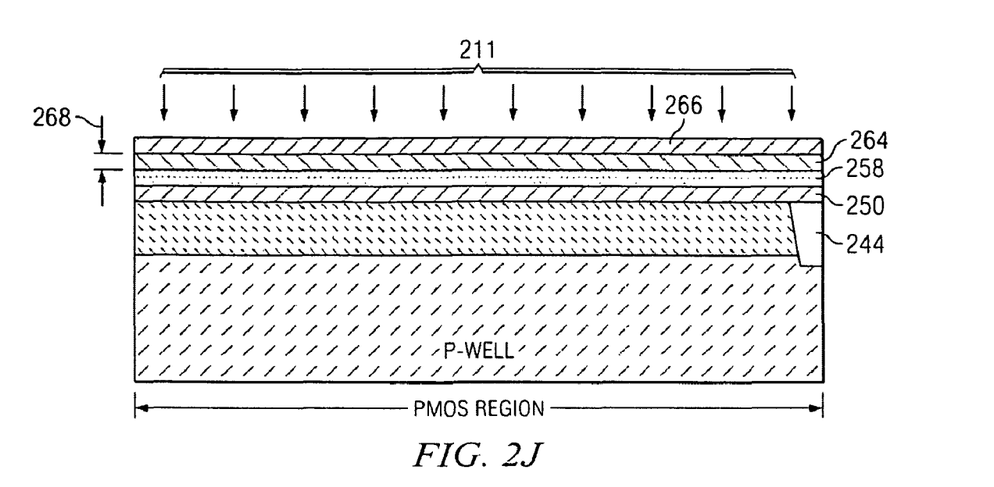
Figure 2K:
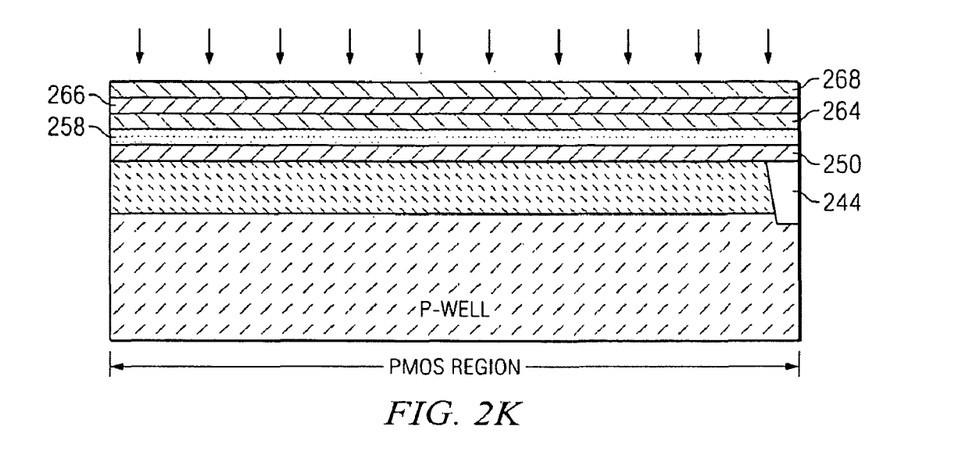

FIG. 2J illustrates one embodiment where a first metal layer 264 and a second metal layer 266 are formed in the pMOS region. The first metal layer 264 is of a predetermined thickness 268 and is deposited on the high-k dielectric layer 258. The predetermined thickness 268 of the first metal layer 264 can be from 0.2 nanometers to 2.0 nanometers, for example 0.75 nanometers. The first metal layer 264 is different from the second metal layer 266, and comprises at least one of the following: MoAlN, AlN, Al2O2, RuO2, RuAlN, and/or RuAlO. The second metal layer is different from the first metal layer, and comprises at least one of the following: TaN, TaSiN, RuN, and/or TaSiO.

In one embodiment, the first metal layer can comprise at least one of the following: MoAlN, AlN, Al2O2, RuO2, RuAlN, and/or RuAlO, and therefore, the second metal layer 266 can comprises one of the following: TaN, TaSiN, and/or RuN. In one embodiment, the first metal layer 264 can comprise at least one of the following: MoAlN, and/or RuAlN, and therefore, the second metal layer 266 can comprise at least one of the following: TaN, TaSiO, and/or RuN. At FIG. 2K a silicon layer 268 is formed on the high-k metal gate. Thereafter, standard CMOS process flow may proceed.

Figure 2L:
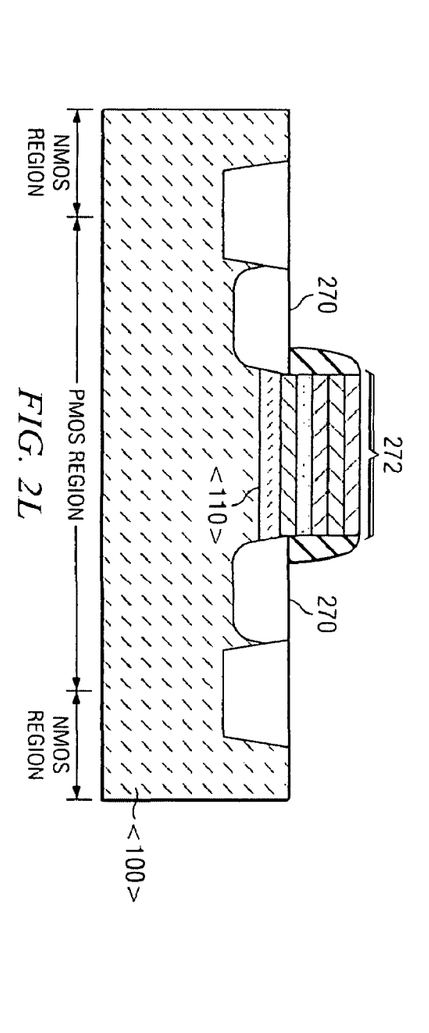

FIG. 2L depicts an example of an integrated circuit device after CMOS process flow. The pMOS region is illustrated next to an nMOS region. The nMOS region has a polysilicon gate (not shown) formed through standard CMOS processes and the pMOS region illustrates the high-k metal gate stack 272 formed thereon as discussed above. Source/drain regions 270 are formed through standard process flow.

Although the invention has been shown and described with respect to a certain aspect or various aspects, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated example embodiments of the invention. In addition, while a particular feature of the invention may have been disclosed with respect to only one of several aspects of the invention, such feature may be combined with one or more other features of the other aspects as may be desired and advantageous for any given or particular application. Furthermore, to the extent that the term "includes" is used in either the detailed description or the claims, such term is intended to be inclusive in a manner similar to the term "comprising."

What is claimed is:

1. A method for fabricating an integrated circuit, the method comprising:
   providing a semiconductor body having a surface comprising a first region, a second region and a border region disposed between the first region and second region, wherein the first region has a first crystal orientation associated therewith and the second region has a second crystal orientation associated therewith, wherein the first crystal orientation is different from the second crystal orientation;
   oxidizing the surface of the semiconductor body therein defining a sacrificial portion, wherein the sacrificial portion extends across the surface of the semiconductor body and has a predetermined thickness extending into the semiconductor body from the surface thereof, the oxidizing of the surface at least partially consuming defects associated with the semiconductor body;
   removing the sacrificial portion of the semiconductor body from the surface thereof; and
   forming a high-k metal gate stack on the first region of the semiconductor body, wherein the high-k metal gate stack comprises a high-k dielectric and a first metal layer of a predetermined thickness extending above the semiconductor body;
   wherein oxidizing the surface of the semiconductor body further comprises forming a step in the semiconductor body between the first region and the second region, wherein forming the step is based, at least in part, on a difference in a rate of oxidation of the surface between the first region and the second region, and wherein the step in the semiconductor body remains after the sacrificial portion is removed.

2. The method of claim 1, further comprising forming a polysilicon gate structure in the second region, wherein the semiconductor body comprises a DSB semiconductor substrate.

3. The method of claim 1, further comprising forming a shallow trench isolation feature in the border region, wherein forming the shallow trench isolation feature consumes defects that are associated with the semiconductor body.

4. The method of claim 1, wherein forming the high-k metal gate stack comprises:
   forming an intermediary interface layer comprising at least one of SiO2 or RTNO;
   forming the high-k dielectric over the intermediary interface layer;
   performing a first nitridation anneal that incorporates nitrogen into the high-k dielectric; and
   forming the first metal layer and a second metal layer over the high-k dielectric.

5. The method of claim 4, further comprising:
   performing a second nitridation anneal that is a sequential anneal for removing impurities introduced; and
   forming a silicon layer on the second metal layer;
   wherein the first nitridation anneal introduces nitrogen to the high-k dielectric by plasma or thermal anneal, and the second nitridation anneal comprises at least one of a nitride anneal or an ammonia anneal.

6. The method of claim 1, wherein the high-k metal gate stack further comprises a second metal layer formed over the first metal layer, and wherein the first metal layer has a composition different from the second metal layer, and comprises at least one of MoAlN, AlN, Al2O2, RuO2, RuAlN or RuAlO.

7. The method of claim 6, wherein the second metal layer has a composition different from the first metal layer, and comprises at least one of TaN, TaSiN, RuN or TaSiO.

8. The method of claim 1, further comprising generating one or more alignment marks on the semiconductor body based, at least in part, on the step in the semiconductor body between the first region and the second region, and wherein removing the sacrificial portion comprises a wet etch or chemical-mechanical polishing the surface of the semiconductor body.

9. The method of claim 8, further comprising utilizing the one or more alignment marks in a lithographic process.

10. The method of claim 1, wherein providing the semiconductor body comprises:
    providing a DSB substrate having a top layer associated with the first crystal orientation and a handle layer associated with the second crystal orientation;
    masking the first region;
    amorphizing the second region;
    recrystallizing the second region; and
    annealing the DSB substrate at a temperature greater than 1050C;
    wherein amorphizing the second region comprises implanting at least one of silicon ions or germanium ions into the second region.

11. The method of claim 10, wherein recrystallizing the second region comprises a solid phase epitaxy process in an ambient nitrogen environment at a temperature of between approximately 550C and 700C.

12. The method of claim 1 for forming the integrated circuit comprising a pMOS device, wherein providing the semiconductor body comprises:
    providing a DSB substrate having a top layer and a handle layer that is underlying the top layer, wherein the top layer has the first crystal orientation, and wherein the handle layer has the second crystal orientation;
    masking a portion of a surface of the top layer of the DSB substrate, therein generally defining the first region under the masked portion, the second region not under the masked portion, and the border region disposed between the masked and not masked portions;
    amorphizing the second region;
    recrystallizing the second region into the second crystal orientation using the handle layer as a template; and
    forming the high-k metal gate stack on the top layer of the DSB substrate in the first region.

13. The method of claim 12, wherein the high-k dielectric comprises at least one of HfO2, HfSiO, HfZrO, ZrO2 or ZrSiO; and the high-k dielectric has a maximum thickness of 4 nanometers.

14. The method of claim 12, wherein the first metal layer has a different composition than the second metal layer; the first metal layer comprises at least one of MoAlN, AlN, Al2O2, RuO2, RuAlN or RuAlO; and the second metal layer comprises at least one of TaN, TaSiN, RuN or TaSiO.

15. The method of claim 12, further comprising: wherein forming the high-k metal gate stack comprises:

forming the high-k dielectric;
performing a first nitridation anneal that incorporates nitrogen into the high-k dielectric;
forming the first metal layer over the high-k dielectric; and
forming a second metal layer over the first metal layer.

16. The method of claim 15, further comprising:
performing a second nitridation anneal that is sequential to the first nitridation anneal for removing impurities introduced; and
depositing a silicon layer over the second metal layer;
wherein the first nitridation anneal introduces nitrogen to the high-k dielectric by plasma or thermal anneal, and the second nitridation anneal comprises at least one of a nitride anneal or an ammonia anneal.

17. The method of claim 12,
wherein oxidizing the surface comprises oxidizing a predetermined thickness of the top layer, therein defining a sacrificial portion of the top layer;
wherein removing the sacrificial layer comprises wet etching the top layer of the DSB substrate, therein removing the sacrificial portion from the DSB substrate; and
further comprising forming a shallow trench isolation feature in the border region, wherein the shallow trench isolation feature at least partially removes defects.

18. The method of claim 17, further comprising forming a polysilicon gate structure in the second region.

19. A method for forming an integrated circuit comprising a pMOS device, the method comprising:
providing a DSB substrate having a top layer and a handle layer that is underlying the top layer, wherein the top layer has a first crystal orientation, and wherein the handle layer has a second crystal orientation differing from the first crystal orientation;
masking a portion of a surface of the top layer of the DSB substrate, therein generally defining a first region at the masked portion, a second region at an unmasked portion, and a border region disposed between the first region and second region;
amorphizing the second region by implanting ions into the unmasked portion;
recrystallizing the second region into the second crystal orientation using the handle layer as a template, wherein the border region is at an interface of the first crystal orientation and the recrystallized second crystal orientation;
annealing the DSB substrate;
thermally oxidizing a predetermined thickness of the top layer at a temperature of less than approximately 900C, to form a sacrificial portion of the top layer;
removing the oxidized sacrificial portion using a wet etch to at least partially remove defects at the border region;
forming a shallow trench isolation feature in the border region, wherein the shallow trench isolation feature consumes remaining portions of the defects;
forming a high-k metal gate stack on the top layer of the DSB substrate comprising:
forming an intermediary interface;
forming a high-k dielectric over the intermediary interface;
performing a nitridation anneal that incorporates nitrogen into the high-k dielectric;
forming a first metal layer over the high-k dielectric; and
forming a second metal layer, whose composition is different from the first metal layer, over the first metal layer
wherein thermally oxidizing the top layer includes forming a step in the top layer between the first region and the second region based, at least in part, on a difference in a rate of oxidation of the top layer between the first region and the second region, and wherein the step in the top layer remains after the removal of the oxidized sacrificial portion by the wet etch.

20. The method of claim 19, wherein the nitridation anneal is a first nitridation anneal, and the method further comprises:
performing a second nitridation anneal that is sequential to the first nitridation anneal for removing impurities introduced;
depositing a silicon layer over the second metal layer; and
forming a polysilicon gate structure in the second region;
wherein the first nitridation anneal introduces nitrogen to the high-k dielectric by plasma or thermal anneal, and the second nitridation anneal comprises at least one of a nitride anneal or an ammonia anneal;
wherein the first metal layer comprises at least one of MoAlN, AlN, Al2O2, RuO2, RuAlN or RuAlO; and
wherein the second metal layer comprises at least one of TaN, TaSiN, RuN or TaSiO.

* * * * *